United States Patent
Jeung

(10) Patent No.: US 8,598,833 B2
(45) Date of Patent: Dec. 3, 2013

(54) ELECTRICALLY COMMUNTATED MOTOR WITH DATA COMMUNICATION DEVICE

(75) Inventor: Young Chun Jeung, Cypress, CA (US)

(73) Assignee: Sntech Inc., Phoenix, AZ (US)

( * ) Notice: Subject to any disclaimer, the term of this patent is extended or adjusted under 35 U.S.C. 154(b) by 187 days.

(21) Appl. No.: 12/966,968

(22) Filed: Dec. 13, 2010

(65) Prior Publication Data

US 2011/0140644 A1    Jun. 16, 2011

Related U.S. Application Data

(60) Provisional application No. 61/285,889, filed on Dec. 11, 2009.

(51) Int. Cl.
G05B 1/06    (2006.01)

(52) U.S. Cl.
USPC ... 318/640; 318/400.4; 318/577; 318/400.24; 318/599; 388/819; 388/912; 388/917; 388/907.5; 398/139; 398/164; 398/117; 398/118; 398/128; 607/61

(58) Field of Classification Search
USPC .............. 318/16, 400.24, 444, 128, 266, 286, 318/469, 280, 640, 577, 400.4; 388/819, 388/912, 917, 907.5; 398/115, 106, 112, 398/140, 182, 9, 22, 15, 23, 138, 135, 130, 398/128, 118, 116, 117, 164, 139; 607/61
See application file for complete search history.

(56) References Cited

U.S. PATENT DOCUMENTS

| | | | |
|---|---|---|---|
| 4,371,814 A * | 2/1983 | Hannas | 318/16 |
| 4,525,763 A | 6/1985 | Hardy et al. | |
| 4,612,488 A * | 9/1986 | Uhlemann et al. | 318/582 |
| 5,508,595 A * | 4/1996 | Schaefer | 318/444 |
| 5,767,635 A | 6/1998 | Steffens et al. | |
| 6,199,018 B1 | 3/2001 | Quist et al. | |
| 6,758,051 B2 | 7/2004 | Jayanth et al. | |
| 6,995,539 B1 | 2/2006 | Hansson et al. | |
| 7,050,939 B2 | 5/2006 | Palmer et al. | |
| 7,243,270 B2 | 7/2007 | Taniguchi et al. | |
| 7,290,450 B2 | 11/2007 | Brown et al. | |
| 7,383,474 B2 | 6/2008 | Sekizawa | |
| 7,635,960 B2 * | 12/2009 | Mullet et al. | 318/280 |
| 7,657,161 B2 | 2/2010 | Jeung | |
| 7,812,556 B2 | 10/2010 | Jeung | |
| 8,004,141 B2 | 8/2011 | Jeung | |

(Continued)

FOREIGN PATENT DOCUMENTS

JP    2005-168241 A    6/2005
KR    10-2008-0019807 A    3/2008

*Primary Examiner* — Eduardo Colon Santana
*Assistant Examiner* — Jorge Carrasquillo
(74) *Attorney, Agent, or Firm* — Knobbe Martens Olson & Bear LLP

(57) ABSTRACT

An electronically commutated motor (ECM) includes windings, a power switch, an infrared transceiver and an electromagnetic shield. The power switch is configured to provide pulse width modulated (PWM) power signals to the windings and to generate a substantial level of electromagnetic noises at PWM frequencies during its switching operation. The infrared transceiver is configured to communicate with an external device using infrared signals and convert electrical signals from and to infrared signals that carry data. The electromagnetic shield is configured to substantially shield the infrared transceiver from the electromagnetic noises of PWM frequencies from the power switch.

19 Claims, 8 Drawing Sheets

(56) References Cited

U.S. PATENT DOCUMENTS

| | | | |
|---|---|---|---|
| 2003/0014087 A1* | 1/2003 | Fang et al. | 607/48 |
| 2005/0107847 A1* | 5/2005 | Gruber et al. | 607/61 |
| 2008/0084171 A1 | 4/2008 | Leehey et al. | |
| 2009/0315494 A1 | 12/2009 | Jeung et al. | |
| 2009/0315496 A1 | 12/2009 | Jeung et al. | |
| 2009/0315497 A1 | 12/2009 | Jeung et al. | |
| 2009/0315498 A1 | 12/2009 | Jeung et al. | |
| 2010/0021176 A1* | 1/2010 | Holcombe et al. | 398/115 |

\* cited by examiner

| TAP | Program 1 Speed (RPM) | Program 2 Speed (RPM) |
|---|---|---|
| T1 | 600 | 300 |
| T2 | 800 | 650 |
| T3 | 1100 | 850 |
| T4 | 1400 | 1070 |
| T5 | 1800 | 1200 |

*FIG. 6*

ELECTRICALLY COMMUNTATED MOTOR WITH DATA COMMUNICATION DEVICE

CROSS-REFERENCE TO RELATED APPLICATION

This application claims priority to and the benefit of Provisional Application No. 61/285,889, filed Dec. 11, 2009, the disclosure of which is incorporated herein by reference in its entirety.

BACKGROUND

1. Field

The present disclosure relates to an electrically commutated motor having a data communication device.

2. Discussion of Related Technology

Electronically commutated motors which are also referred as brushless DC ("BLDC") motors are widely used. For example, a heating, ventilating and air conditioning ("HVAC") systems use electronically commutated motors. In an HVAC system, an electronically commutated motor ("ECM") is operated in a particular operation mode. An ECM has a controller which controls the operation of the motor and stores data needed for such particular operation mode. The data can be transmitted from a programming device, for example, a computer, to program the controller. To this end, an ECM includes a data communication device.

The foregoing discussion in this section is to provide general background information, and does not constitute an admission of prior art.

SUMMARY

One aspect of the invention provides an electronically commutated motor. The ECM can comprise: windings; a power switch configured to provide pulse width modulated (PWM) power signals to the windings, wherein the power switch is configured to generate a substantial level of electromagnetic noises at PWM frequencies during its switching operation; an infrared transceiver configured to communicate with an external device using infrared signals and configured to convert electrical signals from and to infrared signals that carry data; an electromagnetic shield configured to substantially shield the infrared transceiver from the electromagnetic noises of PWM frequencies from the power switch.

In the foregoing motor, the electromagnetic shield may substantially entirely cover electrical and optical components of the infrared transceiver. But for the electromagnetic shield, the substantial level of electromagnetic noises at PWM frequencies would have interfered with conversion between electrical signals and infrared signals in the infrared transceiver. The electromagnetic shield may comprise an electrically conductive case and an optical panel connected to the electrically conductive case, wherein the optical panel comprises an electrically conductive grid allowing transmission of infrared signals therethrough. The electrically conductive case and the optical panel may define a substantially closed space which encloses the infrared transceiver.

Still in the foregoing motor, the electromagnetic noises of PWM frequencies may comprise noise signals at 1-40 kHz. The electromagnetic noises of PWM frequencies may comprise noise signals at about 20 kHz. The infrared signals may comprise a carrier frequency from about 120 kHz to about 180 kHz. The motor may further comprise a motor housing accommodating the power switch and the infrared transceiver. The motor may further comprise a microprocessor configured to receive the data, wherein the motor does not comprises an opto-isolator located between the transceiver and the microprocessor. The motor does not comprise a terminal configured to be electrically connected to the external device.

Another aspect of the invention provides a method of updating motor data in an electrically commutated motor. The method may comprises: providing an electronically commutated motor which comprises windings, a microprocessor, an infrared transceiver, and an electromagnetic shield covering the infrared transceiver; supplying pulse width modulated (PWM) power signals to the windings, thereby operating the motor; receiving, by the infrared transceiver, infrared signals from an external device while supplying the PWM power signals to the windings, the infrared signals carrying motor data, converting, by the infrared transceiver, the infrared signals to electrical signals while supplying the PWM power signals to the windings; and transmitting the electric signals toward the microprocessor, wherein the electromagnetic shield substantially shields the infrared transceiver from a substantial level of electromagnetic noises at PWM frequencies generated when providing the PWM power signals to the windings.

In the foregoing method, the electromagnetic shield may substantially entirely cover electrical and optical components of the infrared transceiver. The electromagnetic shield may comprise an optical panel allowing transmission of infrared signals therethrough while blocking the electromagnetic noises at PWM frequencies. The electromagnetic noises of PWM frequencies may comprise noise signals at 1-40 kHz. The infrared signals may comprise a carrier frequency from about 120 kHz to about 180 kHz. The converted electric signals are not converted to optical signals until arriving to the microprocessor.

Still in the foregoing method, the motor may comprise a motor housing accommodating the power switch and the infrared transceiver, and blocking an infrared light that contains the infrared signals when an incident of the infrared light is greater than a predetermined angle which is smaller than 90°. The method may further comprise converting, by the infrared transceiver, electric signals from the microprocessor into infrared signals while supplying the PWM power signals to the windings; and transmitting the converted infrared signals to the external device. The motor is not electrically connected to the external device while receiving the infrared signals.

BRIEF DESCRIPTION OF THE DRAWINGS

FIG. 6 is an example of data to be stored in an ECM.

DETAILED DESCRIPTION OF EMBODIMENTS

Figure 1:
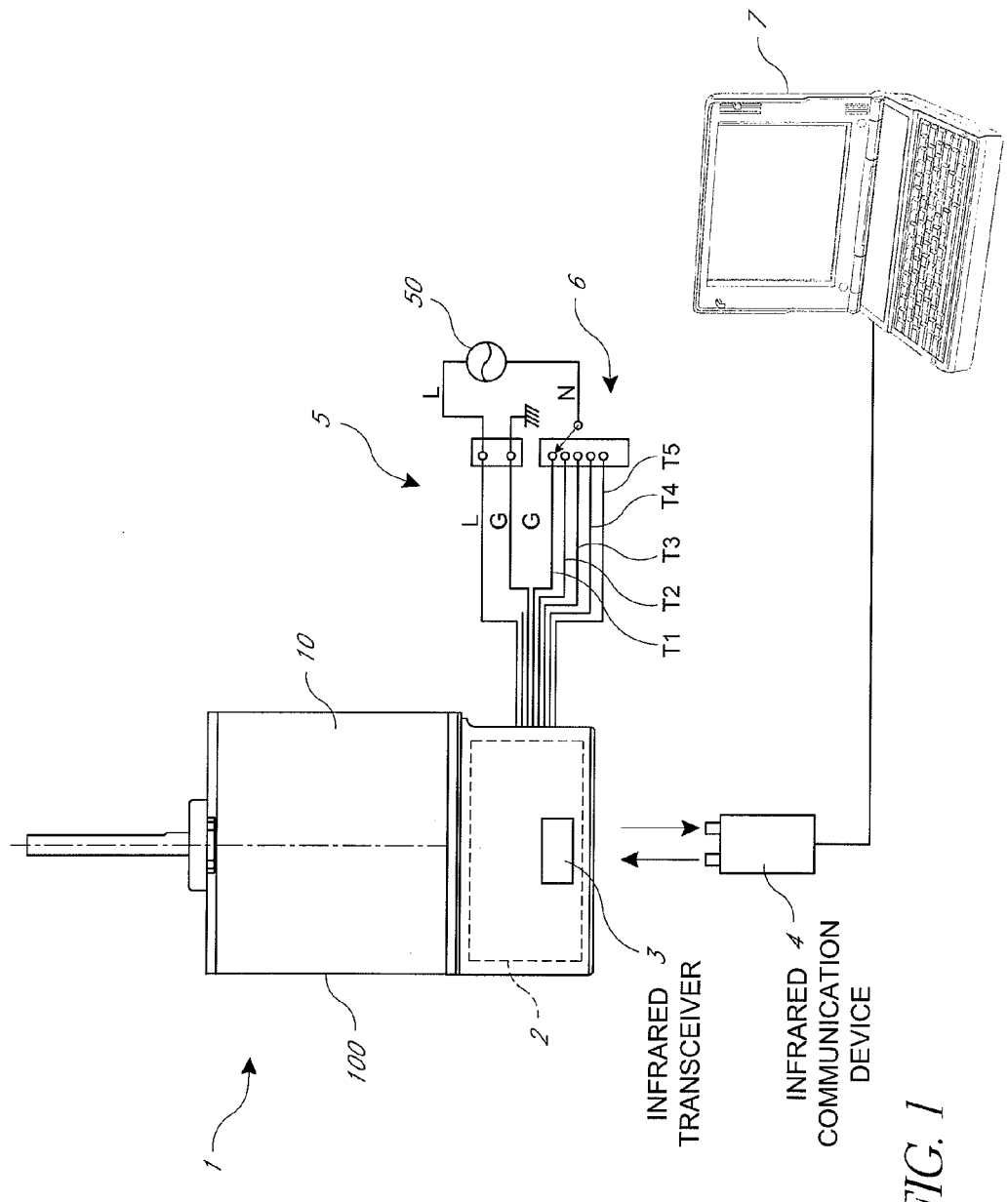
FIG. 1 is a schematic view of an ECM programming system, showing an ECM and an external programming device in accordance with an embodiment.

Various embodiments are described below.

Electronically Commutated Motor

Electronically commutated motors are used in various apparatus or machines including, for example, a heating, ventilating and air conditioning ("HVAC") system. Typically, an electronically commutated motor includes a rotor having plural permanent magnetic poles and a stator having plural electromagnetic poles with windings. The rotor is connected to a blower of the HVAC system via a shaft to rotate the blower.

In embodiments, the ECM can be a 2 (two) phase ECM which includes 6×n permanent magnet poles and 4×n stator poles with windings, where n is an integer greater than 0. Such 2 phase ECM for a HVAC system is disclosed in U.S. Patent Application Publication No. 2006-0244333 A1, the disclosure of which is incorporated by reference in its entirety.

The ECM can be operated in a specific operation mode required by the HVAC system. For example, the ECM is operated in a constant speed mode to rotate the blower in a constant rotational speed. Alternatively, the ECM can be operated in a constant airflow mode. In this mode, the rotation of the rotor is controlled such that the blower provides a constant airflow rate. In the other embodiment, the ECM can be operated in a constant torque mode. Examples of the ECM operation are disclosed in U.S. Pat. No. 7,657,161 B2, the disclosure of which is incorporated by reference in its entirety.

An ECM includes electric circuits which supply controlled electric power to the windings such that the ECM is operated in a specific operation mode. For brevity, an example using a constant speed mode is further explained in this specification, but other operation mode can be used for operating an ECM. In the constant speed mode, the electric circuit controls and switches electric power applied to the windings so as to maintain the rotational speed constant or a specific range.

Power Switching

Among the electric circuits, a power supply supplies electric power to the windings to magnetize the stator poles of the ECM. A controller switches and controls the electric power supplied to the windings to operate the ECM in a constant speed mode. Examples of such controller are disclosed in U.S. Pat. No. 7,812,556 B2, the disclosure of which is incorporated by reference in its entirety.

PWM Control

In some ECMs, a controller can be designed for PWM control. In the PWM control method, pulse width modulated signals are used to regulate the current sent to the windings. In embodiments, the controller includes a microprocessor which generates speed control PWM signals. The controller processes the speed control PWM signals and other signals acquired from sensors, for example, Hall effect sensors, to generate PWM switching signals. The controller includes power switches which switch electric power supplied to the windings based on the PWM switching signals. Thus, PWM power signals are supplied to the windings. Examples of such PWM control are disclosed in U.S. Pat. No. 7,812,556 B2, the disclosure of which is incorporated by reference in its entirety.

In accordance with embodiments, the PWM power signals have frequency components ranging from about 1 kHz to about 40 kHz, but not limited thereto. In embodiments, the PWM frequency is about 1 kHz, about 5 kHz, about 10 kHz, about 14 kHz, about 16 kHz, about 18 kHz, about 19 kHz, about 20 kHz, about 22 kHz, about 24 kHz, about 27 kHz, about 30 kHz, about 35 kHz, or about 40 kHz. In other embodiments, the PWM frequency may be within a range defined by two of the foregoing frequencies.

Data Communication with External Device

In some ECMs, the microprocessor stores programs and data, for example, preset speed data for a constant speed mode. ECM manufacturers, for example, SNTech, Inc., can program ECMs by sending such program and data to microprocessors of the ECMs. Alternatively, buyers of ECMs, for example, HVAC system manufacturers can program the ECM by sending such programs and data to the microprocessors. To program the microprocessor, the ECM communicates with a programming device, for example, a computer which has and operates a motor programming software.

In certain situations, such programming device may need to acquire data such as electric current supplied to the windings, torque, rotational speed, etc from an ECM to be programmed. To acquire such data the programming device communicates with the ECM. In some ECMs, such data communication between an ECM and a programming device can be performed while the ECM is operating. Alternatively, the data communication between the ECM and the programming device can be performed while the ECM is not operating.

Wired Data Communication between ECM and Programming Device

In some ECMs, for data communication with an external device, an ECM can include an interface circuit connected to a controller of the ECM. The interface circuit has a connector which is to be coupled to communication cables extending from the programming device. By connecting the cable to the connector, the wired communication system is constructed to program the controller of the ECM. Examples of such wired communication system are disclosed in U.S. Pat. No. 7,812,556 B2, the disclosure of which is incorporated by reference in its entirety.

In such wired communication, the programming device transmits electric signals (data) to the ECM. In a certain situation, an electric surge or unwanted electric signals generated from the external device or other sources can be transmitted to the ECM via the communication cables and the interface circuit. To protect the controller of the ECM from such surge or unwanted signals, opto-isolators can be used in the interface circuit. Also, the ECM can have an isolated power supply circuit which supplies electric power to the interface circuit and is isolated from other circuits of the ECM. In some motors, an isolated DC/DC converter is used to provide electric power to the interface circuit.

Wireless Data communication between ECM and Programming Device

Figure 2:
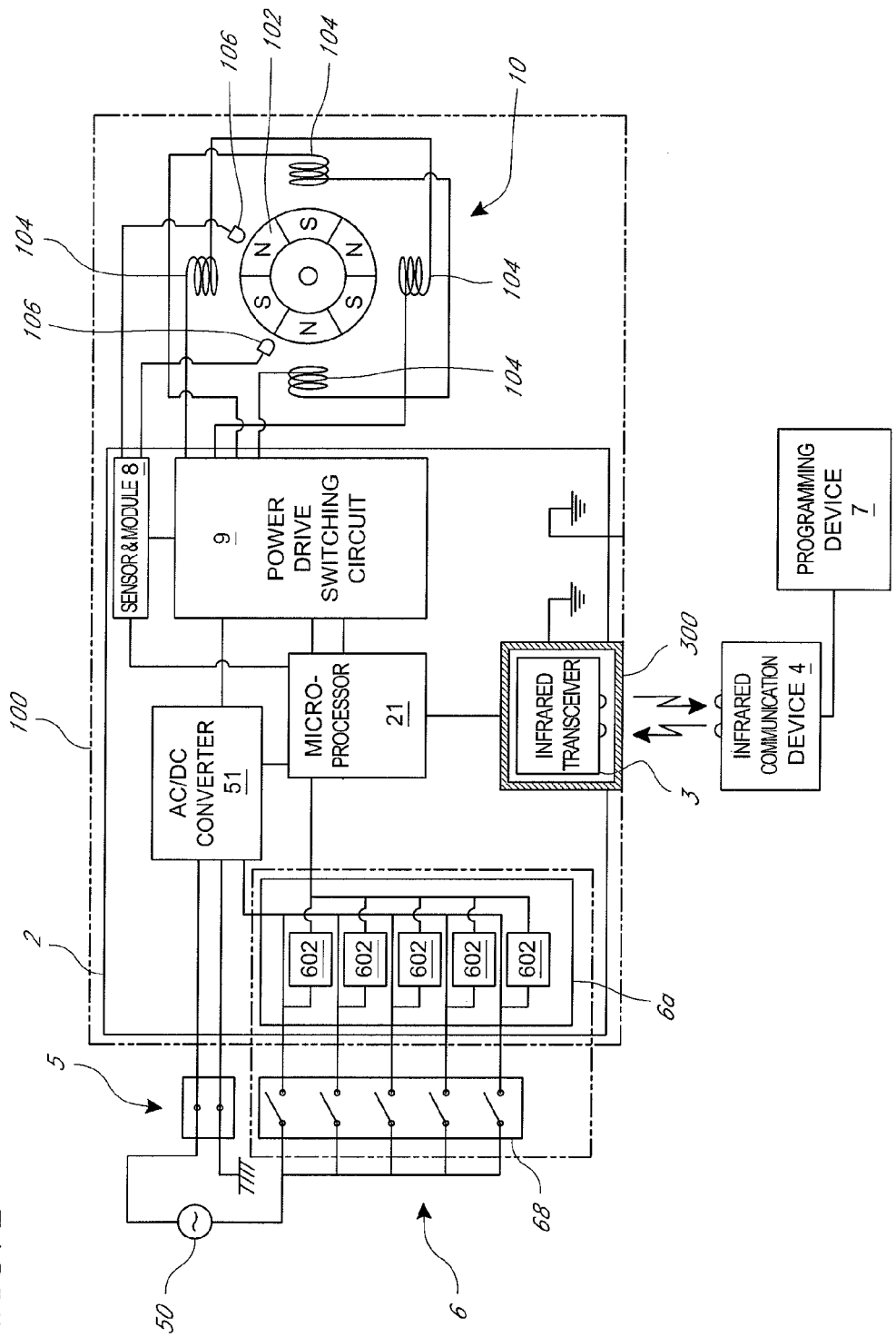
FIG. 2 is a block diagram of an ECM programming system shown in FIG. 1.

In accordance with embodiments, wireless data communication can be performed between an ECM and a programming device in replacement of wired communication. Referring to FIGS. 1 and 2, the ECM 1 has an infrared ("IR") transceiver 3 which is electrically connected to a microprocessor 21. In one embodiment, the programming device 7 is connected to an independent infrared communication device 4. In another embodiment, the programming device 7 includes an infrared communication module therein.

In the illustrated embodiments, programming data are transmitted from the programming device 7 to the external device 4, and then converted to infrared signals in the external device 4. The infrared signals transmitted to the infrared transceiver 3 of the ECM 1. The received infrared signals are converted into electric signals in the transceiver 3, and then the converted electric signals are transmitted to the microprocessor 21. As such, programming data can be transmitted from the programming device 7 to the ECM 1. Similarly, data generated in the ECM 1 during its operation can be transmitted to the programming device 7.

Figure 3:
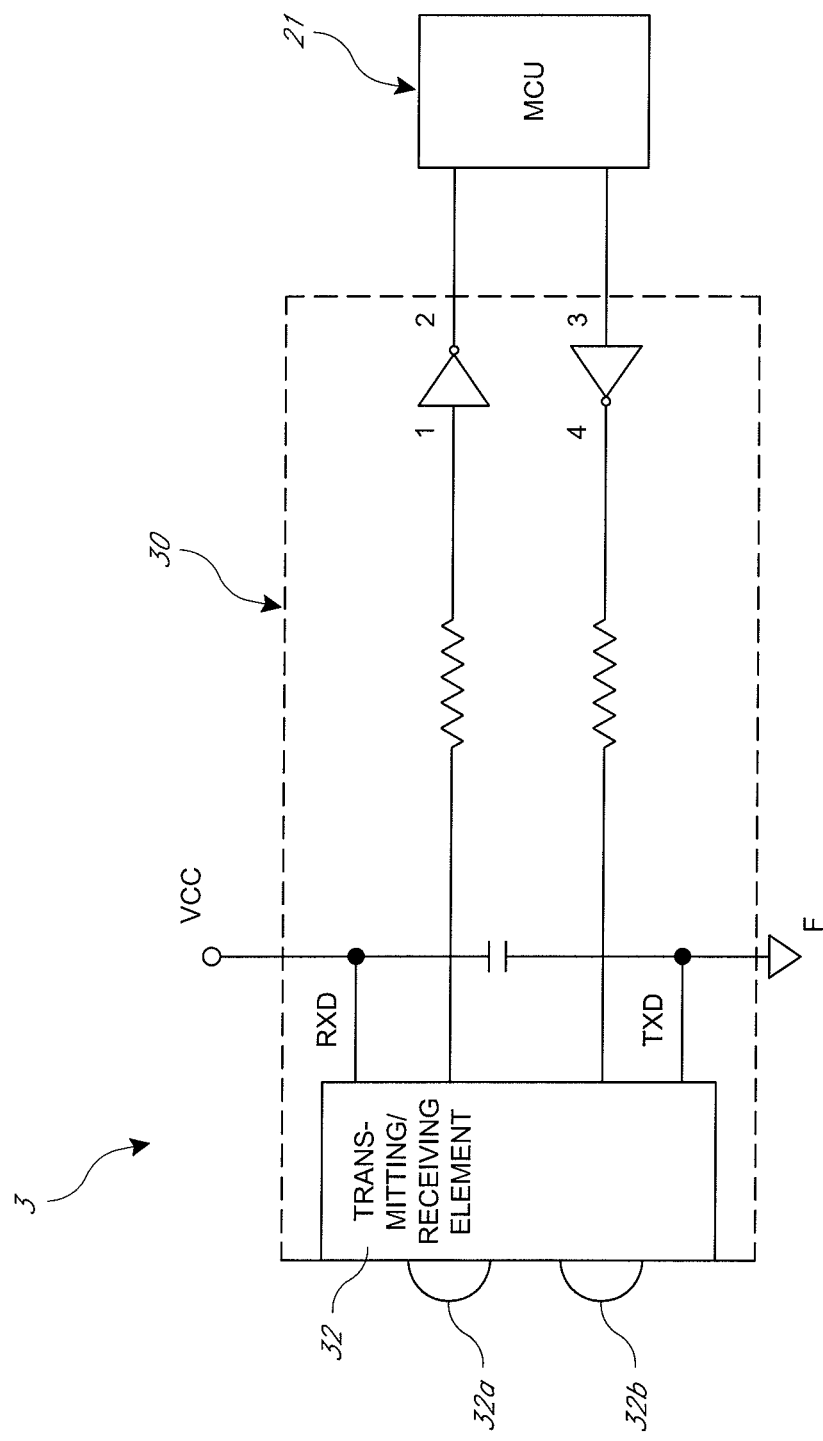
FIG. 3 is a circuit diagram of a light signal transceiver.
Figure 4:
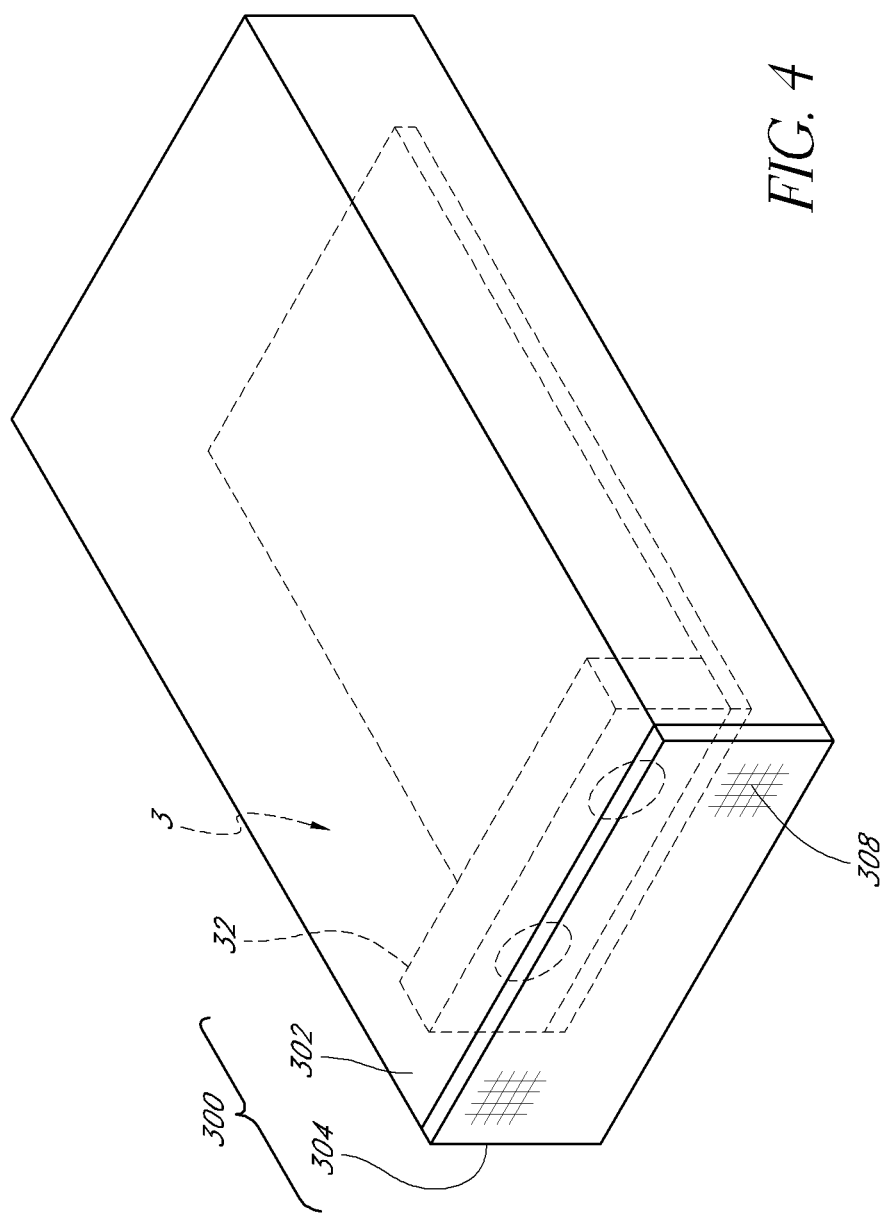
FIG. 4 is a perspective view an electromagnetic shield for a light signal transceiver.

With reference to FIGS. 1 to 4, the transceiver 3 includes optical components and electric components so as to receive optical signals and convert them into electric signals. The optical components have an optical signal transmitting element 32b and an optical signal receiving element 32a so as to transmit/receive infrared signals. In one embodiment, the transmitting element and the receiving element can be incorporated in a single piece device as shown in FIGS. 3 and 4. Alternatively, the receiving and transmitting elements can be separated. The infrared signals which are transmitted and received by the transceiver 3 can have a carrier frequency from about 120 kHz to about 180 kHz, but not limited thereto.

The transceiver 3 is electrically connected to the microprocessor 21 via terminals or wires. In embodiments, the terminals or wires can be fixed and connected to a circuit board of the ECM 1 by way of, for example, soldering. By fixing the terminals to the circuit board, the transceiver can be fixed in a position within the motor.

Such wireless communication can provide several advantages. Even if electric surges or unwanted electric signals are generated from the programming device 7 or the other sources and transmitted to the infrared device 4, such electric surges or unwanted electric signals cannot be transferred to the ECM. Thus, the ECM can be protected from damage by such electric surges or unwanted electric signals which could be transferred to the ECM in the wired communication. Thus, the wireless data communication does not require opto-isolators or an isolated power supply which would have been needed in the wired communication. In some embodiments, the ECM does not include an opto-isolator between the transceiver 3 and the microprocessor 21. Thus, the converted electric signals are not converted to optical signals until the converted electric signals arrive to the microprocessor 21. In certain embodiments, the ECM does not include an isolated DC/DC converter.

Interference from Electromagnetic and Electronic Noises at PWM Frequencies

In some embodiments, the wireless communication can be performed while the ECM is operating. Alternatively, the wireless communication can be performed while the ECM is not operating. The wireless communication during the motor's operation can be interfered with electromagnetic noises generated within the ECM. As discussed above, the ECM is driven by PWM power signals of particular frequencies, in some embodiments, from about 1 kHz to about 40 kHz, in one embodiment, of about 20 kHz.

When the ECM is operating by PWM power signals, a significant level of electromagnetic and electronic noises can be generated from electric circuits including the controller and windings. A significant amount/level of the electromagnetic noises includes the PWM frequency components. Further, a significant amount/level of the electronic noises includes the PWM frequency components. Such noises can also include harmonic frequency components of the PWM frequency. In certain embodiments, the electronic noises are at a level from about 0.2 mV to about 10 mV.

In embodiments, PWM frequency components of the electromagnetic noises are at a substantial level about 10 dB, about 12, dB, about 14 dB, about 16 dB, about 18 dB, about 20 dB, about 22 dB, about 24 dB, about 26 dB, about 28 dB, about 30 dB, about 32 dB, about 34 dB, about 36 dB, about 38 dB, about 40 dB, about 42 dB, about 44 dB, about 46 dB, about 48 dB, or about 50 dB. In some embodiments, the PWM frequency components of the electromagnetic noises are at a level ranging between two of levels listed in the immediately foregoing sentence.

In the foregoing paragraph, the substantial level of PWM frequency components in the electromagnetic noises have frequencies at about 2 kHz, about 4 kHz, about 6 kHz, about 8 kHz, about 10 kHz, about 12 kHz, about 14 kHz, about 16 kHz, about 18 kHz, about 20 kHz, about 22 kHz, about 24 kHz, about 26 kHz, about 28 kHz, about 30 kHz, about 32 kHz, about 34 kHz, about 36 kHz, about 38 kHz or about 40 kHz. In some embodiments the PWM frequency components have frequencies ranging between two frequencies listed in the immediately foregoing sentence.

The electromagnetic noises at PWM frequency components can interfere with the wireless data communication. In particular, the PWM electromagnetic noises can interfere with the conversion of infrared signals to electric signals in the infrared transceiver 3. Such interference may cause failure of the data communication. Further, the electronic noises can be transferred to the infrared transceiver via conductive lines of a circuit board, for example, ground line, and can influence the operation of the infrared transceiver 3, in particular, the conversion of infrared signals to electric signals in the infrared transceiver 3. Such electronic noises may also cause failure of the data communication.

Electromagnetic Shield

In embodiments, ECMs can avoid the interference of the PWM electromagnetic noises with the wireless communication by shielding the infrared transceiver using an electromagnetic shield. The electromagnetic shield substantially entirely covers electrical components and optical components of the infrared transceiver to sufficiently protect the components of the infrared transceiver 3 from the interference of the noises. Alternatively, the shield partially covers the electrical components and optical components of the infrared transceiver so that the interference of the PWM electromagnetic noises is reduced in the extent that the data communication is successfully performed.

In embodiments, PWM frequency components of the electromagnetic noises within the electromagnetic shield are at a level about 5 dB, about 4.5, dB, about 4 dB, about 3.5 dB, about 3 dB, about 2.75 dB, about 2.5 dB, about 2.25 dB, about 2 dB, about 1.75 dB, about 1.5 dB, about 1.25 dB, about 1 dB, about 0.9 dB, about 0.8 dB, about 0.7 dB, about 0.6 dB, about 0.5 dB, about 0.4 dB, about 0.3 dB, about 0.2 dB, about 0.15 dB, about 0.125 dB, about 0.1 dB, about 0.09 dB, about 0.08 dB, about 0.07 dB, about 0.06 dB, about 0.05 dB, about 0.04 dB, about 0.03 dB, about 0.02 dB, or about 0.01 dB. In some embodiments, the PWM frequency components of the electromagnetic noises within the electromagnetic shield are at a level ranging between two of levels listed in the immediately foregoing sentence. Here, the electromagnetic noises reaching the infrared transceiver passing the electromagnetic shield have frequencies at about 2 kHz, about 4 kHz, about 6 kHz, about 8 kHz, about 10 kHz, about 12 kHz, about 14 kHz, about 16 kHz, about 18 kHz, about 20 kHz, about 22 kHz, about 24 kHz, about 26 kHz, about 28 kHz, about 30 kHz, about 32 kHz, about 34 kHz, about 36 kHz, about 38 kHz or about 40 kHz. In some embodiments the frequencies of the electromagnetic noises range between two frequencies listed in the immediately foregoing sentence.

Referring to FIGS. 2 and 4, in embodiments, the electromagnetic shield has an electrically conductive case, for example, a metal case 302, which can accommodate optical components 32 and electrical components of the transceiver 3. The case 302 has a side which is open. The transceiver 3 is located inside the case 302 such that the optical components are located at or near the open side. The open side is covered by an optical panel 304 attached to the case 302. The optical panel 304 becomes a portion of the shield 300. In this configuration, the case 302 and the panel 304 collectively define a substantially closed space in which the infrared transceiver 3 is enclosed. Referring to FIG. 2, the electromagnetic shield 300 is connected to the electric ground of the circuit of the ECM. This increases the area of the electric ground of the circuit, which improves absorbency of electronic noises in the ground of the circuit. Thus, the influence of the electronic noises at PWM frequency components is minimized.

In the foregoing configuration, the shield may have small openings. Such small openings may be provided, for example, to allow the connecting terminals or the connecting wires to pass therethrough. Size of such openings, however, can be minimized so that the electromagnetic shield sufficiently protects the components of the infrared transceiver from the interference of the noises. Thus, in spite of such openings, the electromagnetic shield can substantially entirely cover electrical components and optical components of the infrared transceiver to minimize the interference of the noises.

But for the electromagnetic shielding, the substantial level of electromagnetic and/or electronic noises at PWM frequencies would have interfered with conversion between electrical signals and infrared signals in the infrared transceiver. As a result, the shield 300 can guarantee stable wireless communication.

Motor Housing

Referring to FIGS. 1, 2, 5A and 5B, in accordance with embodiments, the ECM has a motor housing 100 accommodating the stator, the rotor 102 and electric circuits including the infrared transceiver 3. The motor housing 100 is constructed of an electrically conductive material, for example, a metal. The motor housing 100 includes an opening 110 which allows the infrared signals passes therethrough.

As shown in FIG. 2, the motor housing 100 is electrically connected to the ground to which the electromagnetic shield 300 is connected. In a certain embodiment, the motor housing is constructed of a single piece, but not limited thereto. In other embodiments, the motor housing includes two or more pieces electrically connected to each other.

Figure 5:
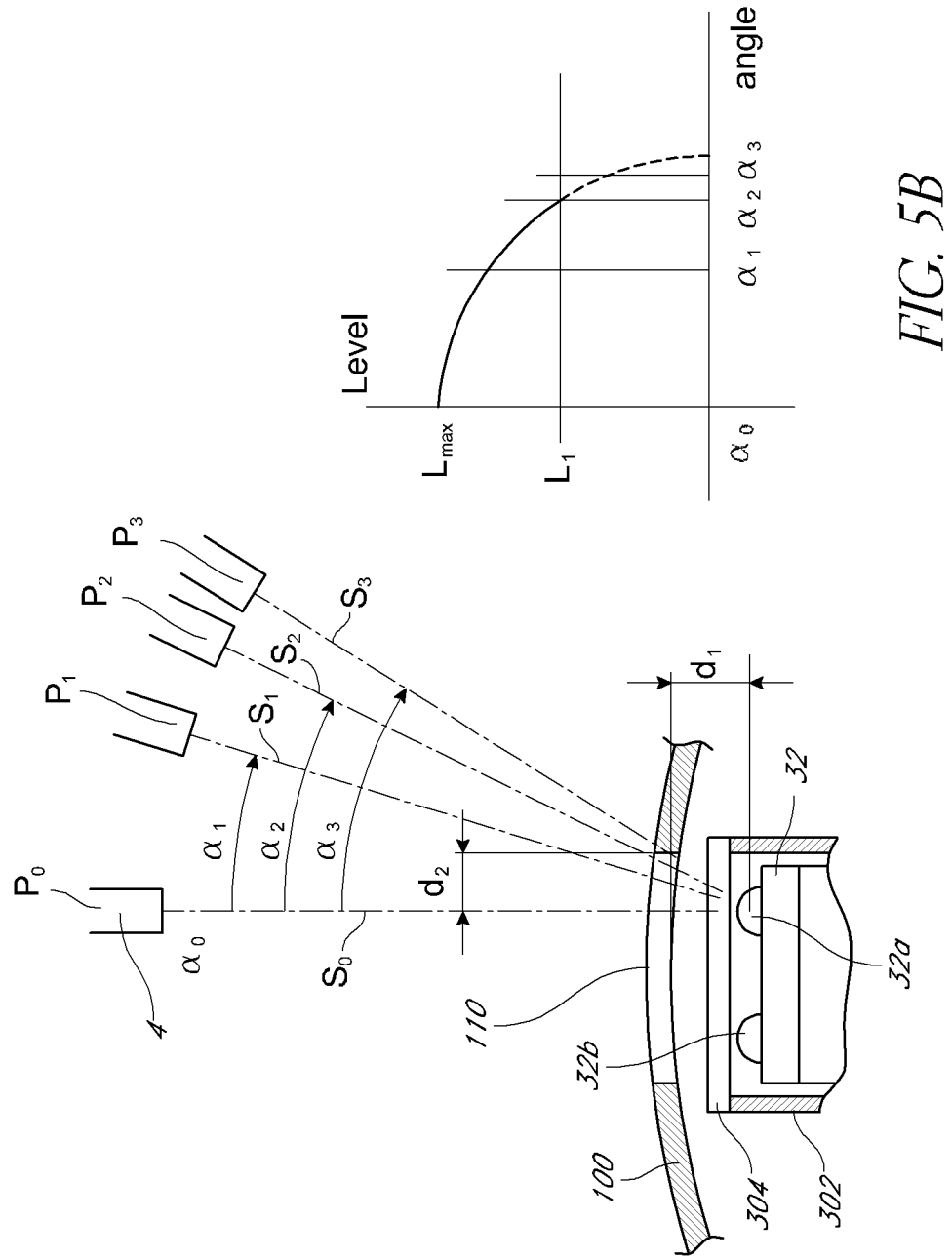
FIG. 5A is a sectional view showing the location relationship between a motor housing and a light signal transceiver.
FIG. 5B is a graph showing the relationship between strength of light signals received by a transceiver and incidence angles of the light signals.

In accordance with embodiments, the location of the transceiver 3 relative to the housing 100 (or the opening 110) is determined to induce a user to use the external device 4 in a manner so that likelihood of data communication failure is minimized. Referring to FIG. 5A, the transceiver 3 is contained within the motor housing 100. The motor housing 100 has an opening 110 which allows infrared signals to pass therethrough. As shown in FIG. 5A, the transceiver 3 is spaced from the motor housing 100 inwardly, and a portion of the optical panel is covered by a portion of the housing wall located at a periphery of the opening 110.

In the embodiments illustrated in FIG. 5A, the distance $d_1$ (between the motor housing wall and the light receiving portion 32a) and the distance $d_2$ (between the light receiving portion 32a and the opening boundary) are determined such that the housing wall 100 block a light from the module 4 with an incidence angle greater than a predetermined angle, for example, $\alpha_2$. In the embodiment illustrated in FIG. 5A, when a user places the external device 4 at a position $P_1$ and operates it, a light signal $S_0$ has an incidence angle $\alpha_0$, and reaches the receiving portion 32a. Similarly, the device 4 placed at positions $P_2$, $P_3$ transmits light signals $S_1$, $S_2$ having incidence angles $\alpha_1$, $\alpha_2$, respectively, which can reach the receiving portion 32a. However, when a user places the external device 4 at a position $P_3$ and operates it, a light signal $S_3$ has incidence angle $\alpha_3$ and is blocked by the motor housing wall 100. This configuration induces the user not to place the device 4 at the location $P_3$.

In accordance with embodiments, the predetermined angle ranges from about 15° to about 75°. In embodiments, the predetermined angle can about 15°, about 18°, about 22°, about 25°, about 30°, about 33°, about 35°, about 39°, about 45°, about 50°, about 60°, or about 75°. In other embodiments, the angle may be within a range defined by two of the foregoing angles.

FIG. 5B shows that likelihood of communication failure is reduced when the incidence angle of a light signal is limited to a range between $\alpha_0$ and $\alpha_2$ as shown in FIG. 5A. As illustrated in FIG. 5B, a level of the light signal received by the transceiver 3 decreases when the incidence angle increases. When the level or strength of the light signal is low, the likelihood of data communication failure increases. Thus, in some embodiments, light signals having the incidence angle greater than a predetermined angle, for example, $\alpha_2$ is blocked. In other words, a light signal $S_3$ is blocked to minimize the likelihood of communication failure. This configuration guarantees the receiving portion 32a to receive light signals having a level greater than a predetermined level, for example, $L_1$. Thus, the data communication failure can be avoided.

In accordance with embodiments, a method of updating the motor data is discussed hereinafter. Referring to FIGS. 1 and 2, a programmer prepares data to be updated using the computer 7. The external infrared device 4 is connected to the computer 7 to communicate with the motor 1. The ECM 1 described in the above is operated. In embodiments, the ECM 1 is assembled with a blower of a HVAC system and operated. To operate the ECM 1, the pulse width modulated (PWM) power signals are supplied to the windings 104.

In embodiments, the external device 4 is arranged to face the transceiver 3 of the ECM 1 such that an incidence angle of a light transmitted from the external device to the transceiver 3 is smaller than the predetermined angle which is discussed above. When the incidence angle is greater than the predetermined angle the motor housing blocks the infrared light.

In the illustrated embodiments, however, the computer 7 or external device 4 is not electrically connected to the ECM 1 such that electric signals of the computer 7 or external device 4 cannot reach to the motor 1. In other words, the motor 1 is electrically isolated from the computer 7 or external device 4.

When the communication devices 3 and 4 are arranged to wirelessly communicate each other, the infrared signals are transmitted from the external device 4 to the transceiver 3. Such transmission is performed while supplying the PWM power signals to the windings, but not limited thereto. The infrared signals carry the data to be stored in the microprocessor 21. The transceiver 3 receives the infrared signals. By the infrared transceiver 3, the received infrared signals are converted to the electrical signals. The conversion is performed while supplying the PWM power signals to the windings, but not limited thereto. The electric signals are transmitted to the microprocessor 21, and the data is stored in the microprocessor 21. In one embodiment, the converted electric signals are not converted to optical signals until arriving to the microprocessor 21.

When providing the PWM power signals to the windings, electromagnetic noises at PWM frequencies and harmonic frequencies are generated. In embodiments, the electromagnetic shield 300 shields the infrared transceiver from such noises. Thus, the infrared signals and the converted signals can be protected from the noises.

In other embodiments, the data such as rotational speeds, electric currents to the windings, and information of PWM signals generated by the microprocessor 21, etc., can be acquired. Such data can be collected by the microprocessor 21 and transmitted to the computer 7. To transmit the data to the computer 7, the microprocessor 21 transmits electric signals to the transceiver 3. In one embodiment, the electric signals are not converted to optical signals until arriving to the transceiver 3. The electric signals are converted to infrared signals by the transceiver 3. The converted infrared signals are transmitted to the external device 4. Thus, the computer 7 can receive such acquired data, which can be used to generate motor programming data.

Additional embodiments are discussed with reference to the drawings hereinafter. Referring to FIG. 1, one embodiment of the invention provides a method and apparatus for programming an electronically commutated motor and selecting a rotational speed of the ECM. A speed selection command can be transmitted to the ECM via AC power lines 5 and 6 connected to an AC power source 50, which are high voltage (for example, 90~260V) lines for operating the ECM. Speed selection data can be transmitted from a motor programming device 7 to the ECM 1 using a wireless data communication between the programming device 7 and the ECM 1. In one embodiment, the wireless data communication can be an optical signal transmission method using, for example, LED, laser, etc. in a desired band (for example, visible, ultraviolet (UV), infrared (IR), etc.). The programming device 7 and the ECM 1 have wireless communication modules 4 and 3, respectively, which can transmit and receive data.

By using power lines for speed selection of the ECM 1, the ECM 1 does not require additional low voltage AC or DC lines, such as 12V or 24V lines, to transmit the speed selection command signal. Further, the ECM 1 can replace typical AC motors which use high voltage lines for speed selection. The use of wireless communication programming is advantageous in that it provides spacious flexibility, and that built-in devices in the ECM, for example, a microprocessor, can be free from electrical noises that may occur when the microprocessor is programmed using electronically wired communication between a programming device and a motor.

FIG. 1 is a schematic diagram of an electronically commutated motor and a programming device in accordance with one embodiment of the present invention. The ECM has a motor part 10 and a controller 2 with an internally built-in microprocessor. The controller 2 has a wireless communication module or light transmitting/receiving module 3 to receive the optical signals, for example, infrared signals. The ECM further has power terminal connectors 5 and 6 to receive power for operating the ECM, and a connector 6 also functions as a signal terminal connector and can receive a speed selection command.

In one embodiment, AC power 50 is connected to the power terminal 5 and a signal terminal connector 6 of the ECM. By selecting one of the switches or taps T1 to T5 of speed selection terminal 6, the ECM can be operated with a specific speed or a specific speed range in accordance with a speed program table, which is stored in the microprocessor. FIG. 6 shows an example of a speed program table in accordance with one embodiment.

Referring to FIGS. 1 and 2, the programming device or programmer device 7, for example, a personal computer (PC), generates the speed program information shown in FIG. 6. Speed programming data are converted into a light signal (for example, IR, UV, etc.) in a light transmitting/receiving module or wireless communication module 4. The light signal is transmitted to the light transmitting/receiving module 3 of the ECM. The light signal is converted into an electric signal and the speed programming data is stored in the microprocessor 21.

In some embodiments, each of the wireless communication modules 3, 4 has a light transmitter and a light receiver. Thus, during the transmission of the data from the programming system, the wireless communication modules 3, 4 can exchange wireless optical signals to conduct bi-directional communication. In certain embodiments, information of the motor's operation can be transmitted from the motor to the programming device via the wireless communication modules 3, 4.

FIG. 2 is a schematic circuit diagram of one embodiment of the ECM. In one embodiment, a power terminal 5 is connected to an AC power 50 to provide AC voltage to an AC/DC converter 51. The AC/DC converter 51 converts AC voltage into DC voltage, which is supplied to the power source for the microprocessor 21, a logic and power drive switching circuit 9 for operating the motor. A rotor position sensor module 8 is connected to the circuit 9 to provide a rotor position detection signal. The sensor module 8 transmits the rotor position signal to the microprocessor 21. The sensor module 8 is connected to Hall effect sensors 106 for sensing the rotor position. The power drive switching circuit 9 provides a motor-operating current, a motor-operating voltage, and motor temperature data to the microprocessor 21. The motor part 10 includes a rotor 102 and windings 104. The Hall effect sensors 106 are located at positions close to the rotor magnet to sense the rotor position.

With reference to FIG. 3, in one embodiment, the transceiver 3 has a signal converting circuit 30 which converts an optical or light signal received in the communication module 3 into an electrical signal and transmits the electrical signal to the microprocessor 21 so that the microprocessor can have speed programming data.

Referring to FIG. 2, in one embodiment, a speed selection terminal 6 is provided to set up a specific speed or speed range of the motor. The AC power is transmitted to the speed selection circuit 6a through system control box contactor 68 to provide a speed selection signal to the microprocessor.

In some embodiments, as shown in FIG. 2, a bi-directional communication system is optionally provided. In the illustrated embodiment, the bi-directional system has wireless communication modules 3, 4. Each of the wireless communication modules 3, 4 has a light transmitter and a light receiver. In one embodiment, the transmitter of the module 3 transmits a light with a wavelength different from that of a light that the transmitter of the module 4 transmits. Alternatively, the transmitters of the modules 3, 4 are configured to transmit signals such that one of the modules does not send a signal during a period when the other module sends a signal. In one embodiment, the modules 3, 4 transmit and receive multiplexed signals.

FIG. 3 is a schematic diagram of one embodiment of a signal converting circuit 30. A transmitting/receiving element 32 is provided to receive and/or transmit optical signals. In one embodiment, the transmitting/receiving element 32 is integrated in one piece. Alternatively, transmitting element and receiving element are separated.

The programmer device 7 such as a PC transmits the low voltage data signal to the optical signal transmitter 4. The optical signal transmitter 4 converts the logic-level data signal into an optical signal, and transmits the converted optical signal to the optical signal element 32. In the signal converting circuit 30, the optical signal received is converted into an electrical signal such that the microprocessor can handle and store speed table data.

Referring to FIG. 6, examples of speed tables stored or to be stored in the microprocessor 21 are disclosed. In one of constant speed modes, data of Program 1 (See FIG. 6) are used. In this operation mode, when a tap switch T1 is connected, the ECM is operated such that the rotor rotates at a rotational speed of about 600 rpm. Similarly, the connection of each of switches T2, T3, T4 and T5 represents the constant speed operation of the ECM having one of rotational speeds of about 800 rpm, about 1100 rpm, about 1400 rpm and about 1800 rpm, respectively. When using data of Program 2 (See FIG. 6), each of the switches T1, T2, T3, T4 and T5 represents each of speeds 300, 650, 850, 1070, and 1200 rpm, respectively. As discussed above, the above speed setting data are transmitted from the external programming device 7 via wireless data communication modules 3 and 4.

Figure 7A:
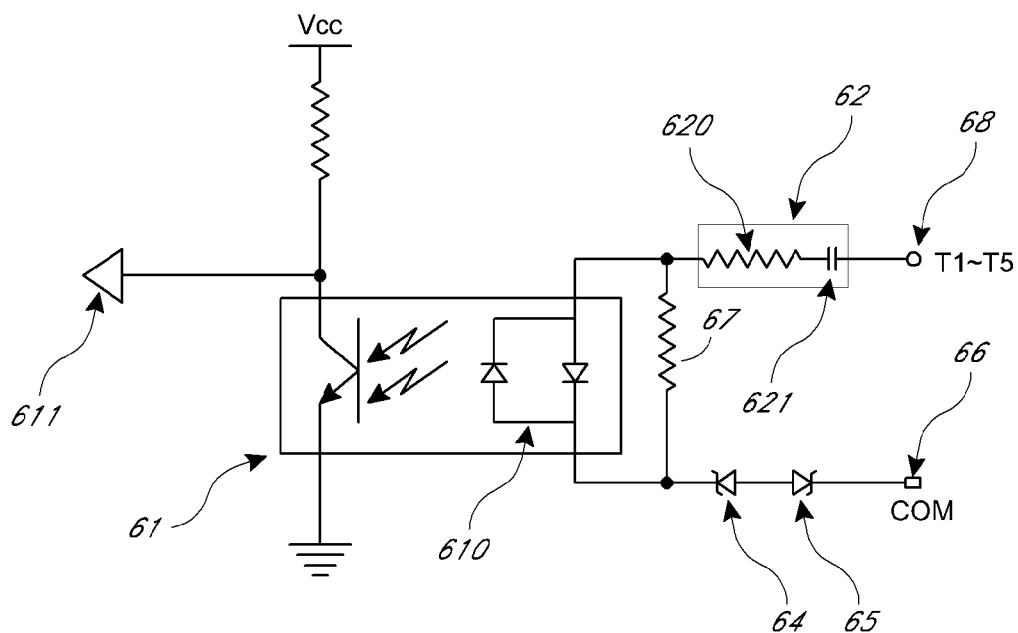
FIG. 7A is a circuit diagram of a speed selection circuit.
Figure 7B:
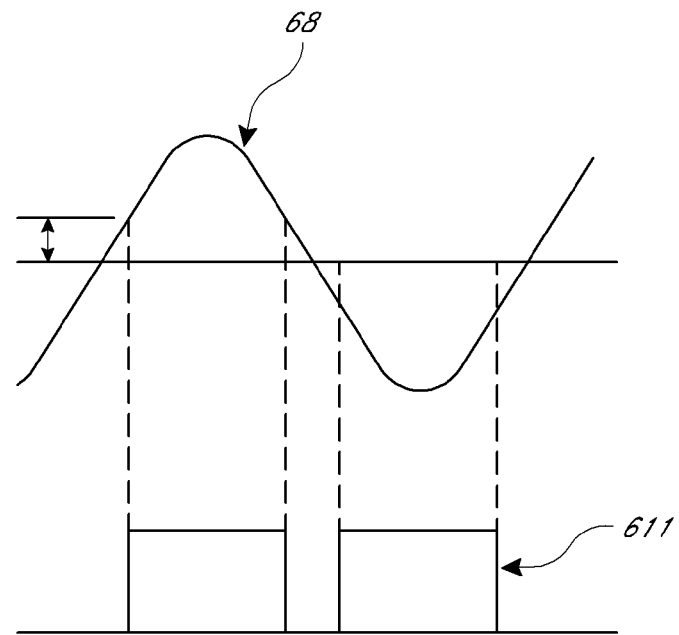
FIG. 7B is a wave diagram of input and output of Zener diodes in the speed selection circuit.

FIG. 7A is a schematic circuit diagram of an isolated coupler circuit 602 of the speed selection circuit 6a. FIG. 7B is a wave diagram of input and output of Zener diodes in series. The speed selection circuit 6a includes an isolated circuit for each of the taps T1-T5, and a current-limiting circuit which includes a resistance 620 and a condenser 621. When AC power source voltage (AC 90~260V) is applied to terminals 66 and 68, the current-limiting circuit limits current, and a voltage difference between two ends of a resister 67 turns on a LED 610 of a bipolar photo coupler 61. In one embodiment, Zener diodes 64, 65 in series transform a sinusoidal wave signal into a fixed-width square wave signal 611 such that the microprocessor 21 can identify selection of the taps. In some embodiments, voltages of Zener diodes are controlled to have different levels. This can help command signals of the taps to be different.

Figure 8:
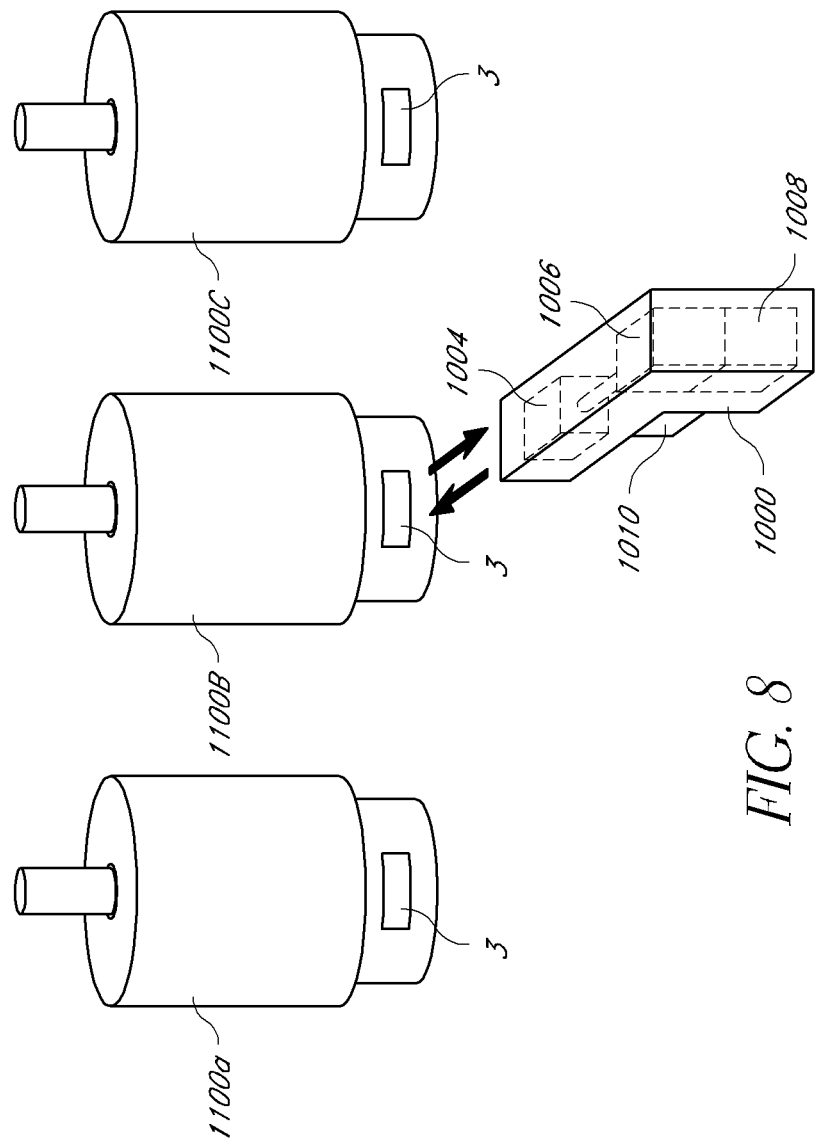
FIG. 8 is a schematic view of another ECM programming system.

FIG. 8 is a schematic view of a method of programming a plurality of motors using a programming device in accordance with one embodiment. In the illustrated embodiment, a stand-alone programming device 1000 is provided. In one embodiment, the programming device 1000 is configured to be handheld shape. The programming device 1000 has a wireless communication module or light transmitting/receiving module 1004 which can communicate with a wireless communication module 3 of each of motors 1100a, 1100b, 1100c. The programming device 1000 has a processor 1006 connected to the module 1004 to provide a speed table data to the module 1004 and a battery 1008. The programming device 1000 has a trigger switch 1010 to initiate programming of a motor 1100a, 1100b or 1100c. In one embodiment, the programming device 1000 can be used to program a plurality of motors 1100a, 1100b, 1100c.

In some embodiments, a plurality of motors 1100a, 1100b, 1100c are arranged in a row such that a window of a module 3 of each motor face in the same direction. An operator can grip a handle such that the module 1004 faces a first one 1100a of the motors, and then push the switch 1010 to initiate programming. A light signal of data is transmitted from the module 1004 to the module 3 of the first motor 1100a. Once finishing the programming of the first motor, the second motor 1100b is programmed in the same manner discussed above.

What is claimed is:

1. An electronically commutated motor (ECM) comprising:
    windings;
    a power switch configured to provide pulse width modulated (PWM) power signals to the windings, wherein the power switch is configured to generate substantial electromagnetic noises during its switching operation;
    an infrared transceiver configured to communicate with an external device using infrared signals and configured to convert electrical signals from and to infrared signals that carry data;
    an electromagnetic shield configured to substantially shield the infrared transceiver from the electromagnetic noises from the power switch; and
    a housing enclosing the windings, the power switch, and the infrared transceiver,
    wherein the electromagnetic shield comprises an electrically conductive case and an optical panel connected to the electrically conductive case, wherein the optical panel comprises an electrically conductive grid allowing transmission of infrared signals therethrough.

2. The motor of claim 1, wherein during normal operation, the electromagnetic noises from the power switch are at a level about 10 dB or higher within the housing.

3. The motor of claim 2, wherein the electromagnetic noises at a level about 10 dB or higher have frequencies at about 1 to about 40 kHz.

4. The motor of claim 1, wherein during normal operation, the electromagnetic noises reaching the infrared transceiver are at a level about 5 dB or lower within the electromagnetic shield.

5. The motor of claim 1, wherein the motor does not comprise, between the microprocessor and the infrared transceiver, a component transforming the converted electric signals to optical signals.

6. The motor of claim 1, wherein the electrically conductive case and the optical panel define a substantially closed space which encloses the infrared transceiver.

7. The motor of claim 1, further comprising a microprocessor configured to receive the data, wherein the motor does not comprises an opto-isolator located between the transceiver and the microprocessor.

8. The motor of claim 1, wherein the motor is not electrically connectable to the external device.

9. A method of updating data in an electrically commutated motor, the method comprising:
    providing an electronically commutated motor which comprises windings, a microprocessor, an infrared transceiver, and an electromagnetic shield covering the infrared transceiver;
    supplying pulse width modulated (PWM) power signals to the windings, thereby operating the motor;
    receiving, at the infrared transceiver, infrared signals from an external device external to the motor;
    converting, at the infrared transceiver, the received infrared signals to electrical signals while supplying the PWM power signals to the windings, wherein the electromagnetic shield substantially shield the infrared transceiver from electromagnetic noises caused by the PWM power signals; and
    transmitting the electrical signals to the microprocessor,
    wherein the infrared transceiver comprises an electrical circuit and an optoelectric sensor, wherein the electromagnetic shield substantially entirely covers both the electrical circuit and the optoelectric sensor.

10. The method of claim 9, wherein during normal operation, the electromagnetic noises from the power switch are at a level about 10 dB or higher within the housing.

11. The method of claim 10, wherein the electromagnetic noises at a level about 10 dB or higher have frequencies at about 1 to about 40 kHz.

12. The method of claim 9, wherein during normal operation, the electromagnetic noises reaching the infrared transceiver are at a level about 5 dB or lower within the electromagnetic shield.

13. The method of claim 9, wherein the electromagnetic shield comprises an optical panel allowing transmission of infrared signals therethrough while substantially blocking the electromagnetic noises.

14. The method of claim 9, wherein the electromagnetic noises have frequencies at about 1 to about 40 kHz.

15. method of claim 9, wherein the infrared signals comprise a carrier frequency from about 120 kHz to about 180 kHz.

16. The method of claim 9, wherein the motor does not comprise, between the microprocessor and the infrared transceiver, a component transforming the converted electric signals to optical signals.

17. The method of claim 9, wherein the motor comprises a motor housing accommodating the power switch and the infrared transceiver, and blocking an infrared light that contains the infrared signals when an incident of the infrared light is greater than a predetermined angle which is smaller than 90°.

18. The method of claim 9, further comprising:
converting, by the infrared transceiver, electric signals transmitted from the microprocessor to infrared signals while supplying the PWM power signals to the windings; and
transmitting the converted infrared signals to the external device.

19. The method of claim 9, wherein the motor is not electrically connected to the external device while receiving the infrared signals.

* * * * *